(12) United States Patent
Suvorov et al.

(10) Patent No.: US 9,768,259 B2
(45) Date of Patent: Sep. 19, 2017

(54) CONTROLLED ION IMPLANTATION INTO SILICON CARBIDE USING CHANNELING AND DEVICES FABRICATED USING CONTROLLED ION IMPLANTATION INTO SILICON CARBIDE USING CHANNELING

(71) Applicant: Cree, Inc., Durham, NC (US)

(72) Inventors: Alexander V. Suvorov, Durham, NC (US); Vipindas Pala, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/281,384

(22) Filed: May 19, 2014

(65) Prior Publication Data

US 2015/0028350 A1  Jan. 29, 2015

Related U.S. Application Data

(60) Provisional application No. 61/858,926, filed on Jul. 26, 2013.

(51) Int. Cl.
*H01L 29/16* (2006.01)
*H01L 21/265* (2006.01)
(Continued)

(52) U.S. Cl.
CPC ........ *H01L 29/1608* (2013.01); *H01L 21/046* (2013.01); *H01L 21/047* (2013.01); *H01L 21/26506* (2013.01); *H01L 21/26586* (2013.01); *H01L 21/324* (2013.01); *H01L 29/0619* (2013.01); *H01L 29/0688* (2013.01); *H01L 29/0878* (2013.01); *H01L 29/1095* (2013.01); *H01L 29/6606* (2013.01);
(Continued)

(58) Field of Classification Search
CPC .............................. H01L 29/15; H01L 21/265
See application file for complete search history.

(56) References Cited

U.S. PATENT DOCUMENTS 5,138,406 A   8/1992 Calviello
5,155,369 A  10/1992 Current
(Continued)

FOREIGN PATENT DOCUMENTS

JP   2011211212 A   10/2011

OTHER PUBLICATIONS

PCT International Search Report and Written Opinion mailed Nov. 14, 2014 for corresponding PCT International Application No. PCT/US14/048217 (10 pages).
(Continued)

*Primary Examiner* — Fernando L Toledo
*Assistant Examiner* — Neil Prasad
(74) *Attorney, Agent, or Firm* — Myers Bigel, P.A.

(57) ABSTRACT

Methods of forming a semiconductor structure include the use of channeled implants into silicon carbide crystals. Some methods include providing a silicon carbide layer having a crystallographic axis, heating the silicon carbide layer to a temperature of about 300° C. or more, implanting dopant ions into the heated silicon carbide layer at an implant angle between a direction of implantation and the crystallographic axis of less than about 2°, and annealing the silicon carbide layer at a time-temperature product of less than about 30,000° C.-hours to activate the implanted ions.

22 Claims, 9 Drawing Sheets

(51) Int. Cl.
| | |
|---|---|
| H01L 21/04 | (2006.01) |
| H01L 29/66 | (2006.01) |
| H01L 29/861 | (2006.01) |
| H01L 29/872 | (2006.01) |
| H01L 29/78 | (2006.01) |
| H01L 29/06 | (2006.01) |
| H01L 29/08 | (2006.01) |
| H01L 29/10 | (2006.01) |
| H01L 21/324 | (2006.01) |

(52) U.S. Cl.
CPC .. *H01L 29/66068* (2013.01); *H01L 29/66712* (2013.01); *H01L 29/7802* (2013.01); *H01L 29/7828* (2013.01); *H01L 29/861* (2013.01); *H01L 29/872* (2013.01)

(56) References Cited

U.S. PATENT DOCUMENTS

| | | | |
|---|---|---|---|
| 5,381,032 | A | 1/1995 | Kokawa et al. |
| 5,681,762 | A | 10/1997 | Baliga |
| 5,895,939 | A | 4/1999 | Ueno |
| 6,091,108 | A | 7/2000 | Harris et al. |
| 6,107,142 | A | 8/2000 | Suvorov et al. |
| 6,600,192 | B1 | 7/2003 | Sugawara et al. |
| 6,618,418 | B2 | 9/2003 | Northrup et al. |
| 6,639,273 | B1 | 10/2003 | Ueno |
| 7,482,285 | B2 | 1/2009 | Qu et al. |
| 7,772,621 | B2 | 8/2010 | Treu et al. |
| 7,829,970 | B2 | 11/2010 | Girdhar et al. |
| 7,910,458 | B2 | 3/2011 | Henley |
| 8,049,272 | B2 | 11/2011 | Henning et al. |
| 8,154,026 | B2 | 4/2012 | Ishii et al. |
| 8,211,770 | B2 | 7/2012 | Zhang et al. |
| 8,232,558 | B2 | 7/2012 | Zhang et al. |
| 2001/0046757 | A1 | 11/2001 | Takahashi et al. |
| 2008/0001159 | A1 | 1/2008 | Ota et al. |
| 2008/0121895 | A1* | 5/2008 | Sheppard et al. ............ 257/76 |
| 2008/0203441 | A1 | 8/2008 | Endo |
| 2008/0251793 | A1 | 10/2008 | Mazzola et al. |
| 2009/0072241 | A1 | 3/2009 | Harris et al. |
| 2009/0250705 | A1* | 10/2009 | Watanabe et al. ............ 257/77 |
| 2010/0032685 | A1 | 2/2010 | Zhang et al. |
| 2010/0258815 | A1 | 10/2010 | Tarui |
| 2011/0198616 | A1 | 8/2011 | Yamashita |
| 2011/0254016 | A1 | 10/2011 | Ryu |
| 2011/0278596 | A1* | 11/2011 | Aigo et al. ............ 257/77 |
| 2013/0062723 | A1 | 3/2013 | Henning et al. |
| 2013/0105889 | A1 | 5/2013 | Fujiwara et al. |
| 2013/0161689 | A1* | 6/2013 | Huo ............ H01L 29/66325 257/141 |

OTHER PUBLICATIONS

PCT International Search Report and Written Opinion mailed Nov. 5, 2014 for corresponding PCT International Application No. PCT/US14/048202 (20 pages).

Janson et al. "Channeling Implants in 6H Silicon Carbide", *Materials Science Forum* vols. 338-342 (2000) pp. 889-892.

Morvan "Damage Reduction in Channeled Ion Implanted 6H—SiC", *Materials Science Forum* vols. 338-342 (2000) pp. 893-896.

Zolnai et al. "Ion Beam Analysis and Computer Simulation of Damage Accumulation in Nitrogen Implanted 6H—SiC: Effects of Channeling", *Materials Science Forum*, vols. 483-485 (2005), pp. 637-640.

PCT International Preliminary Report on Patentability mailed Feb. 4, 2016 for corresponding PCT International Application No. PCT/US14/048217 (8 pages).

PCT International Preliminary Report on Patentability mailed Feb. 4, 2016 for corresponding PCT International Application No. PCT/US14/048202 (17 pages).

Morvan et al., "Channeling Implantations of $Al^+$ into 6H Silicon Carbide", *Applied Physics Letters*, vol. 74, No. 26, Jun. 28, 1999, pp. 3990-3992.

Morvan et al., Lateral Spread of Implanted Ion Distributions in 6H—SiC: Simulation, *Materials Science and Engineering* B61-62, (1999), pp. 373-377.

Wong-Leung et al. "Ion Implantation in 4H—SiC", *Nuclear Instruments and Methods in Physics Research* B 266, (2008), pp. 1367-1372.

Extended European Search Report dated Feb. 3, 2017 issued for corresponding European Application No. 14829761.7, 9 pages.

Itoh et al. "Characterization of Residual Defects in Cubic Silicon Carbide Subjected to Hot-Implantation and Subsequent Annealing", *Journal of Applied Physics* 82, pp. 5339-5347 (1997).

Janson et al., "Ion Implantation Range Distributions in Silicon Carbide", *Journal of Applied Physics* 93, pp. 8903-8909 (2003).

Office Action issued on May 1, 2017 for corresponding Japanese Application No. 2016-530071 (5 pages). (No English translation).

* cited by examiner

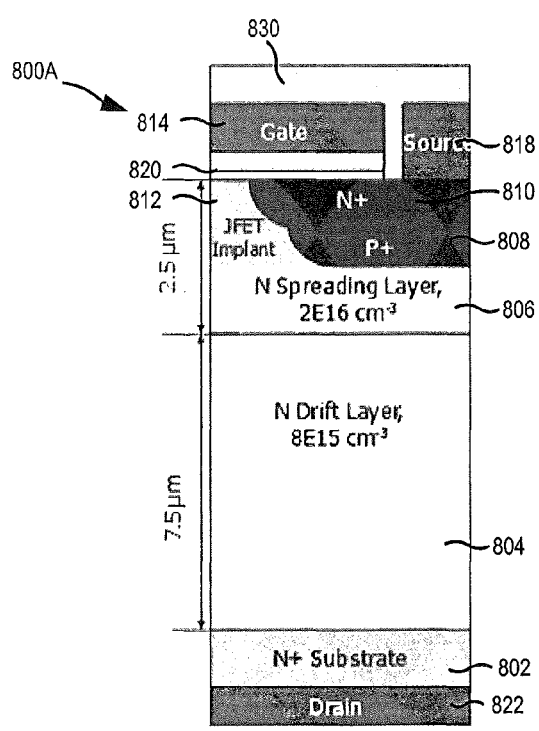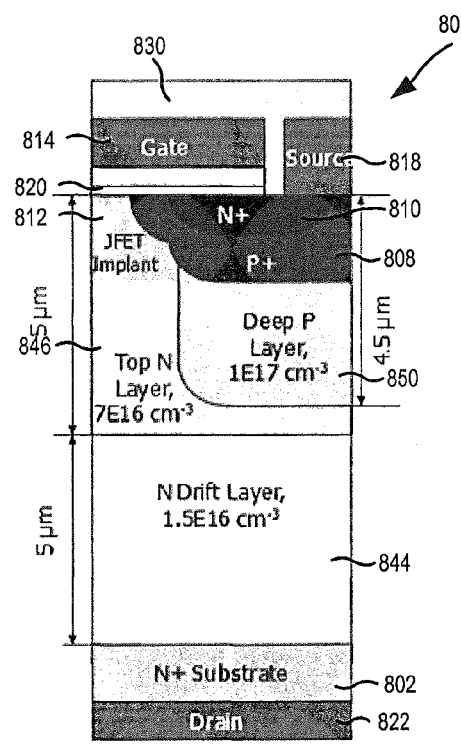
FIGURE 8A  FIGURE 8B
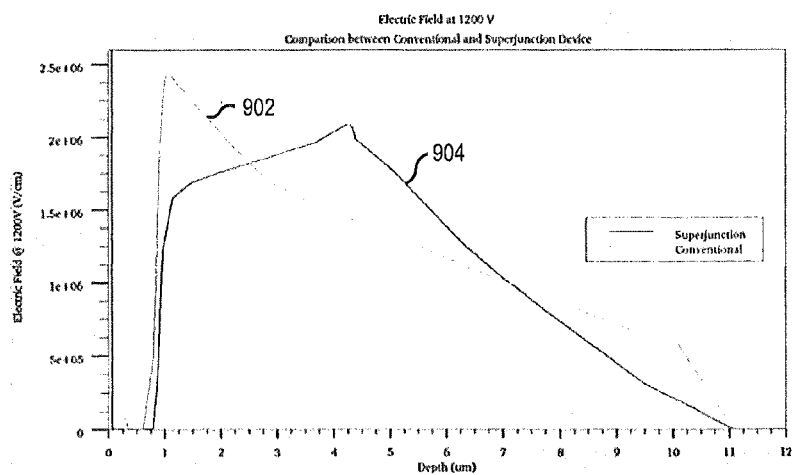
FIGURE 9

CONTROLLED ION IMPLANTATION INTO SILICON CARBIDE USING CHANNELING AND DEVICES FABRICATED USING CONTROLLED ION IMPLANTATION INTO SILICON CARBIDE USING CHANNELING

RELATED APPLICATIONS

The present application claims the benefit of and priority to U.S. Provisional Patent Application No. 61/858,926, filed Jul. 26, 2013 and entitled "Controlled Ion Implantation Into Silicon Carbide Using Channeling And Devices Fabricated Using Controlled Ion Implantation Into Silicon Carbide Using Channeling," the disclosure of which is incorporated herein by reference in its entirety.

FIELD

The present invention relates to semiconductor device fabrication, and, more particularly, to ion implantation for fabricating semiconductor devices.

BACKGROUND

Ion implantation is a semiconductor device fabrication technique that may be used to change the electronic properties of a semiconductor wafer by adding specific dopants to the wafer. More particularly, in conventional ion implantation, a desired ion species to be implanted into the wafer may be ionized, accelerated to a predetermined kinetic energy, and directed as an ion beam towards the surface of a semiconductor wafer loaded in an ion implantation target chamber. Based on the predetermined kinetic energy, the desired ion species may penetrate into the semiconductor wafer to a certain depth. As such, ions may be embedded (i.e., implanted) into the semiconductor wafer, which may thereby alter the electrical properties of the semiconductor wafer.

SUMMARY

Some embodiments provide methods of forming a semiconductor structure. The methods include providing a silicon carbide layer having a crystallographic axis, heating the silicon carbide layer to a temperature of about 300° C. or more, implanting dopant ions into the heated silicon carbide layer at an implant angle between a direction of implantation and the crystallographic axis of less than about 2°, and annealing the silicon carbide layer at a time-temperature product of less than about 30,000° C.-hours to activate the implanted ions.

The implant angle may be greater than 0.1° in some embodiments. In some embodiments, the implant angle may be between 0.1° and 1°, and in some embodiments between 0.1° and 5°.

The silicon carbide layer may include an off-axis silicon carbide layer having an off-axis angle between about 2° and 10°.

The methods may further include controlling the implant angle to reduce a depth of the implanted ions in the silicon carbide layer compared to a depth the implanted ions would have if implanted at an implant angle of 0°.

The methods may further include maintaining the silicon carbide layer at a temperature of about 500° C. or more during the implantation, and in some embodiments maintaining the silicon carbide layer at a temperature of about 1000° C. or more during the implantation.

Implanting the dopant ions may include implanting the dopant ions at an implant energy of about 100 keV or less, while controlling the implanted ions to have a depth of greater than 0.1 microns and less than 1.0 microns. In some embodiments, the dopant ions may be implanted at an implant energy of about 100 keV or less, while controlling the implanted ions to have a depth of greater than 0.2 microns and less than 0.5 microns.

In further embodiments, implanting the dopant ions includes implanting the dopant ions at an implant energy of about 50 keV or less, while controlling the implanted ions to have a depth of greater than 0.1 microns and less than 1.0 microns, and in still further embodiments implanting the dopant ions at an implant energy of about 50 keV or less, while controlling the implanted ions to have a depth of greater than 0.2 microns and less than 0.5 microns.

In further embodiments, implanting the dopant ions includes implanting the dopant ions at an implant energy of about 30 keV or less, while controlling the implanted ions to have a depth of greater than 0.1 microns and less than 1.0 microns, and in still further embodiments implanting the dopant ions at an implant energy of about 30 keV or less, while controlling the implanted ions to have a depth of greater than 0.2 microns and less than 0.3 microns.

In further embodiments, implanting the dopant ions includes implanting the dopant ions at an implant energy of about 10 keV or less, while controlling the implanted ions to have a depth of greater than 0.1 microns and less than 0.5 microns.

The implanted ions may have a depth in the silicon carbide layer that is less than a depth the implanted ions would have if implanted at room temperature.

The silicon carbide layer may be free of a screening layer when the dopant ions are implanted therein.

The methods may further include providing a mask on the silicon carbide layer, the mask exposing portions of the silicon carbide layer, wherein the mask has a thickness less than half of a thickness than would otherwise be required for implants performed at an energy level needed to obtain the same implant depth without channeling, and wherein implanting the dopant ions includes implanting the dopant ions through the mask.

An electronic device according to some embodiments includes a silicon carbide drift region having a first conductivity type and a first doping concentration, a well region in the drift region, the well region having a second conductivity type opposite the first conductivity type and having a second doping concentration, and a deeply implanted region below the well region, wherein the deeply implanted region has a third doping concentration that is greater than the first doping concentration and less than the second doping concentration.

The drift region includes a drift layer having the first doping concentration and a current spreading layer having a fourth doping concentration on the drift layer. The fourth doping concentration may be higher than the first doping concentration of the drift layer and lower than the third doping concentration of the deeply implanted region.

The deeply implanted region may extend to a depth that is less than a thickness of the current spreading layer.

The drift layer may have a thickness that is less than a thickness that would be required to sustain a given reverse blocking voltage in the absence of the deeply implanted region.

The fourth doping concentration of the current spreading layer may be greater than would be required to sustain a given reverse blocking voltage in the absence of the deeply implanted region.

The electronic device may have a lower on resistance than would be obtainable for a given reverse blocking voltage in the absence of the deeply implanted region.

The current spreading layer may have a thickness of from about 2.5 microns to about 4.5 microns.

The current spreading layer a have a doping concentration of from about 1E16 cm$^{-3}$ to about 2E17 cm$^{-3}$.

The drift layer may have a thickness of from about 2.5 microns to about 4.5 microns.

The drift layer may have a doping concentration of from about 6E15 cm$^{-3}$ to about 2E16 cm$^{-3}$.

The deeply implanted region may extend to a depth of from about 2.5 microns to about 4.5 microns into the drift region.

The deeply implanted region may have a doping concentration of from about 1E16 cm$^{-3}$ to about 2E17 cm$^{-3}$.

A Schottky diode according to some embodiments includes a silicon carbide drift region having a first conductivity type and a first doping concentration, and a deeply implanted region in the silicon carbide drift region. The deeply implanted region has a second doping concentration that is greater than the first doping concentration and extends to a first depth that is from about 2.5 microns to about 4.5 microns, and the first depth is less than a thickness of the silicon carbide drift region.

A Schottky diode according to further embodiments includes a silicon carbide drift layer having a first conductivity type and a first doping concentration, a silicon carbide epitaxial layer having a second conductivity type opposite the first conductivity type on the silicon carbide drift layer and having a second doping concentration that is greater than the first doping concentration, wherein the silicon carbide epitaxial layer has a thickness greater than about 2.5 microns, and a deeply implanted region extending through the silicon carbide drift region and into the silicon carbide drift layer, wherein the deeply implanted region has the first conductivity type and has a third doping concentration that is less than the second doping concentration.

A method of forming an electronic device includes providing a silicon carbide drift region having a first conductivity type and a first doping concentration and having a crystallographic axis, forming a well region in the drift region, the well region having a second conductivity type opposite the first conductivity type and having a second doping concentration, and implanting dopant ions to form a deeply implanted region below the well region, wherein the deeply implanted region has a third doping concentration that is greater than the first doping concentration and less than the second doping concentration, and wherein implanting the ions includes implanting the dopant ions at an implant angle between a direction of implantation and the crystallographic axis of less than about 2°.

BRIEF DESCRIPTION OF THE DRAWINGS

FIG. 8A is a schematic block diagram illustrating a conventional DMOSFET structure.

FIG. 8B is a schematic block diagram illustrating a superjunction DMOSFET structure according to some embodiments.

FIG. 9 is a graph of the electric fields under the p-type implants of the devices illustrated in FIGS. 8A and 8B.

DETAILED DESCRIPTION

Figure 1:
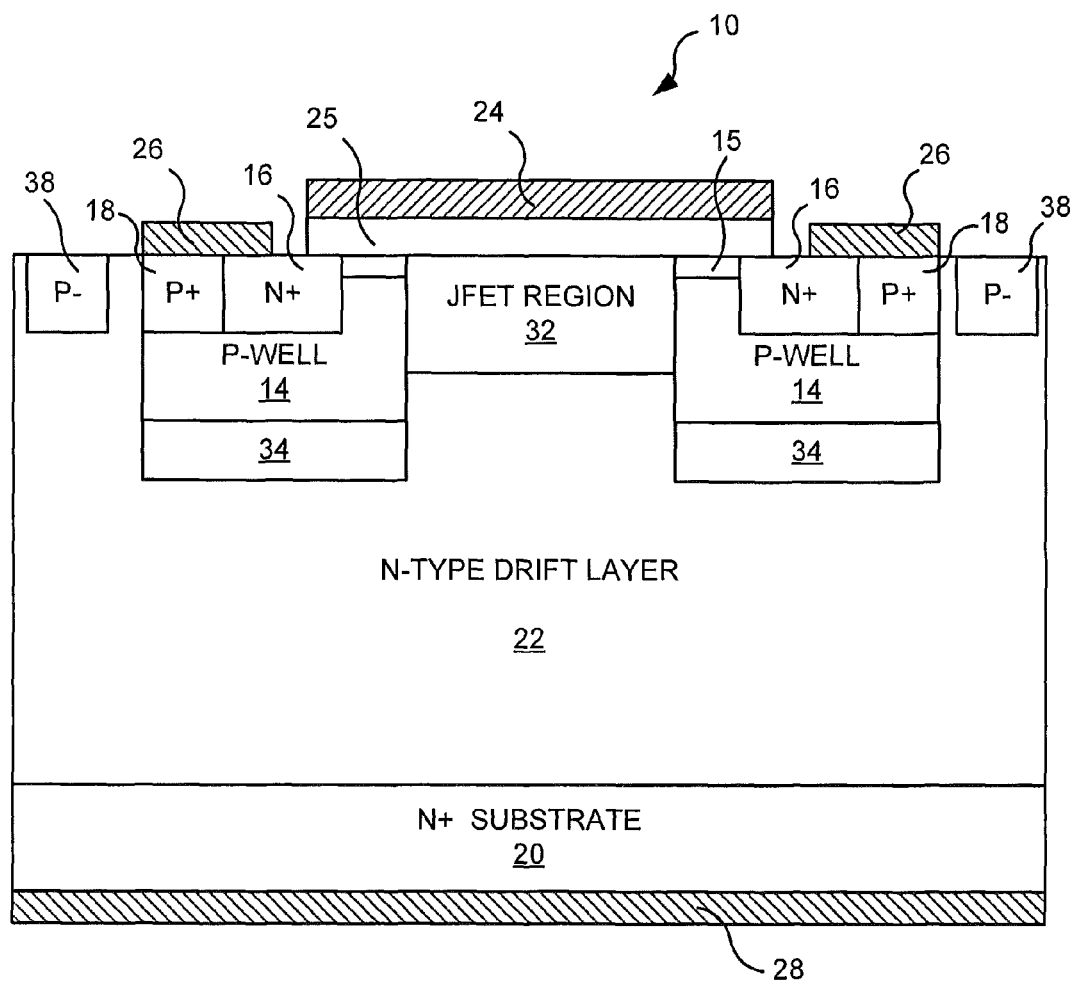
FIG. 1 is a schematic block diagram of a device structure that can be fabricated in accordance with some embodiments.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation, of, for example, light elements such as boron and/or beryllium, may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

The fabrication of semiconductor devices in silicon carbide is difficult, partly due to the high temperatures needed for many device fabrication processes. For example, growth temperatures and annealing temperatures are significantly higher in silicon carbide than in other material systems, such as silicon. In addition, fabrication of silicon carbide devices is made more difficult by the high thermal stability of dopant atoms in silicon carbide. In particular, the high thermal stability of dopant atoms in silicon carbide means that dopant diffusion, a common doping technique in silicon-based device fabrication, is not generally useful in silicon carbide.

Accordingly, in fabricating silicon carbide devices, it is often necessary to use other techniques, such as epitaxial growth/regrowth and ion implantation, to form doped regions in silicon carbide.

The use of epitaxial growth/regrowth and lithography to form doped regions in silicon carbide, while useful, is time consuming and expensive. Such techniques also often require time consuming alignment steps, and may not be suitable for forming all regions needed for device fabrication.

Ion implantation is a flexible and convenient method for selectively doping portions of a silicon carbide layer. In an ion implantation process, dopant ions are accelerated to a high energy, usually expressed in keV or MeV, and directed towards a semiconductor lattice. The implants penetrate the lattice and come to rest somewhere within the lattice. The number of ions implanted into a semiconductor layer, referred to as the dose, is usually expressed in terms of ions per square centimeter ($cm^{-2}$). Selective implantation is performed by masking portions of the layer to prevent ions from penetrating the masked portions of layer.

However, ion implantation has certain well-known drawbacks. In particular, when dopant ions are implanted into a semiconductor layer, the ions cause irradiation damage to the crystal lattice of the semiconductor layer. To repair the lattice damage, the structure must be annealed at relatively high temperatures (e.g. greater than 1200° C., and in some cases greater than 1600° C.). Even with high temperature annealing and/or long anneal times, some lattice damage may remain.

Moreover, conventional ion implantation may not be attractive for use in forming deep implanted regions, or regions requiring a high level of doping uniformity by depth. Implant range, refers to the average depth of implanted ions. The depth of implanted ions is directly related to the energy of the implant, i.e., ions implanted into a semiconductor layer at higher energies tend to go deeper into the layer. Thus, forming deep implanted regions requires high energy implants. However, lattice damage is also directly related to implant energy: higher energy implants also tend to cause more lattice damage than lower energy implants. High energy implants also require thick mask layers, which can cause undesirable shadowing of implants.

As used herein, implant depth refers to the depth of the implanted region, which is greater than the depth at which the peak implant concentration occurs. In particular, implant depth refers herein to the depth at which the concentration of implanted dopants falls below $10^{14}$ $cm^{-3}$. Note that the implant depth may not correspond to the junction depth of a p-n junction formed by the implanted region, as p-n junction location is affected by the doping levels of neighboring regions.

Moreover, to form implanted regions that have good doping uniformity by depth, it is necessary to perform multiple implantation steps with multiple energies and dosages. Each implant step increases the time and cost needed to fabricate the structure.

Embodiments of the present invention are based on a realization that implant channeling can be used to controllably form implanted regions in silicon carbide that are highly uniform by depth using lower energy implants which result in reduced lattice damage. According to some embodiments, the depth of a channeled implant can be controlled by performing the implant at an elevated temperature, which can reduce the depth of the implant. The depth of the implant can also be controlled by altering the angle of the implant. Reducing the lattice damage can reduce the temperature and/or time of the post implant anneal, which can increase fabrication throughput and/or decrease fabrication costs.

In some materials, ion implantation at relatively high temperatures (for example, up to 1800° C.) may provide several advantages, such as damage recovery, structure modification, increased chemical reaction, and/or enhanced diffusion of the implanted species. For example, high-temperature ion implantation into a silicon carbide (SiC) substrate may provide improved activation efficiency of the implanted species, lower sheet resistance of the implanted layer, higher carrier mobility, and/or reduced damage to the silicon carbide substrate as compared to ion implantation at room temperature.

Further, high temperature implantation may lead to more stable devices that show less drift over time and that have better reliability.

Channeling is a phenomenon experienced when ions are implanted along a crystal axis of a semiconductor. When ions are implanted into a crystal lattice, the implanted ions tend to scatter when they impact atoms in the crystal lattice (referred to as impact scattering). When the direction of implantation is oriented at an oblique angle to the major axes of the crystal lattice, the atoms in the lattice appear to have a random distribution relative to the direction of implantation. The likelihood of collisions between implanted ions and atoms in the crystal lattice is thus fairly uniform with increasing depth. If, however, direction of implantation is close to a major axis of the crystal lattice, the atoms in the crystal lattice appear to "line tip" relative to the direction of implantation, and the implanted ions appear to travel down the channels created by then crystal structure. This reduces the likelihood of collisions between the implanted ions and the atoms in the crystal lattice, especially near the surface of the semiconductor layer. As a result, the depth of the implant is greatly increased.

Ordinarily, it is not desirable for the depth of the implant to be increased by channeling, as the depth of the implant may be greater than the desired depth of the implanted region. Because it is difficult to control the depth of a channeled implant using conventional techniques. Thus, in silicon carbide processing for example, it is conventional when implanting ions at an angle that is near a crystallographic axis of the semiconductor layer, to form a sacrificial layer, such as silicon dioxide, on the layer to be implanted, and to implant the semiconductor layer through the amorphous layer. The screen layer has the effect of randomizing the direction of the implanted ions, thereby reducing the channeling effect of the underlying lattice structure.

In general, channeling occurs in silicon carbide when the direction of implantation is within about 2° of a crystallographic axis of the silicon carbide crystal. When the direction of implantation is more than about 2° of a crystallographic axis of the silicon carbide crystal, the atoms in the lattice appear to be randomly distributed relative to the direction of implantation, which reduces channeling effects. As used herein, the term "implant angle" refers to the angle between the direction of implantation and a crystallographic axis, such as the c-axis or <0001> axis, of the semiconductor layer into which ions are implanted. Thus, an implant angle of less than about 2° relative to the c-axis of a silicon carbide layer is expected to result in channeling.

Some embodiments utilize channeled implants for implantation of shallow and/or deep implanted regions in silicon carbide. The depth of the channeled implants may be controlled by controlling the temperature of the implantation and/or through precise control of the direction of implantation relative to the crystallographic axes of the semiconductor layer.

An exemplary structure that may be formed using embodiments described herein is illustrated in FIG. 1. The device 10 shown in FIG. 1 is a MOSFET device having various regions that can be formed by ion implantation. However, it will be appreciated that embodiments disclosed herein can be advantageously employed to form various regions of many different kinds of semiconductor devices, including, for example, metal semiconductor field effect transistors (MESFETs), insulated gate bipolar transistors (IGBTs), Schottky diodes, PIN diodes, etc. Moreover, although certain layers of the device 10 of FIG. 1 are described as having a specified conductivity type (i.e., n-type or p-type), it will be appreciated that the conductivity types of the layers could be reversed (e.g., layers and/or regions designated as n-type could be p-type, and vice versa).

The exemplary structure 10 includes an n-type drift layer 22 on an n+ substrate 20. The substrate 20 may, for example, include a single crystal silicon carbide layer having the 6H polytype, although other polytypes may be used. Moreover, the substrate may have an off-axis orientation of about 2° to about 10°. That is, the c-axis of the hexagonal crystal structure of the silicon carbide crystal may be slightly tilted relative to a direction normal to the substrate surface.

The n-type drift layer 22 may have a doping concentration of about $1E14$ $cm^{-3}$ to about $5E16$ $cm^{-3}$.

P-type wells 14 are provided at an upper surface of the drift layer. The p-type wells 14 may be doped, for example, with p-type dopants, such as aluminum and/or boron ions, at a concentration of about $1E16$ $cm^{-3}$ to $1E19$ $cm^{-3}$. The p-type wells 14 have a junction depth of about 0.3 microns to about 1.2 microns. Deep p-regions 34 are formed beneath the p-type wells 14. The deep p-type regions 34 may be doped, for example, with p-type dopants, such as aluminum and/or boron ions, at a concentration that is higher than the Concentration of the p-type wells 14.

P-guard rings 38 are formed at a periphery of the device at the surface of the drift layer 22. The P-guard rings 38 may be formed to a depth of about 0.5 to about 1.5 microns, and may be doped, for example, with p-type dopants, such as aluminum and/or boron ions, at a concentration of about $1E15$ $cm^{-3}$ to about $1E16$ $cm^{-3}$. In case of devices with deep implants formed by channeling, the guard rings should also be formed by deep implants. Thus, the guard ring depth in these devices may be from about 2.5 μm to about 4.5 μm, as opposed to the conventional depth of 0.5 μm to 1.5 μm.

A junction field effect transistor (JFET) region 32 is formed between the p-type wells 14. The JFET region 32 may have a thickness of about 0.5 microns to about 1.5 microns may be doped, for example, with n-type dopants, such as nitrogen and/or phosphorus ions at a concentration of about $1E15$ $cm^{-3}$ to about $5E17$ $cm^{-3}$.

N+ source regions 16 are formed in the p-well regions 14 and are spaced apart from the JFET region 32 to define channel regions 15 between the n+ source regions and the JFET region. The n+ source regions 16 may be doped, for example, with n-type dopants, such as nitrogen and/or phosphorus ions, at a concentration of about $5E18$ $cm^{-3}$ to $1E21$ $cm^{-3}$. The n+ source regions 16 may have a depth of about 0.2 microns to 1.2 microns.

The channel regions 15 may be implanted with p-type or n-type dopants as desired to obtain a desired threshold voltage. In particular, the channel regions 15 may be doped, for example, with p-type dopants, such as aluminum and/or boron ions, at a concentration of about $1E17$ $cm^{-3}$ to $2E18$ $cm^{-3}$. The channel regions 15 may have a depth of about 50 nm to 300 nm.

P+ well contact regions 18 are formed in the p-well regions 14 adjacent the n+ source regions. The p+ well contact regions 18 may have a depth of about 0.2 microns to 1.2 microns and may be doped, for example, with p-type dopants, such as aluminum and/or boron ions, at a concentration of about $5E18$ $cm^{-3}$ to $1E21$ $cm^{-3}$.

A gate insulator 25, such as silicon dioxide, is provided on the drift layer 22 and extends from the n+ source layers 16 over the channel regions 15 and the JFET region 32. A gate contact 24, which may include polysilicon with a metal overlayer, is on the gate insulator 25.

Source ohmic contacts 26 are formed on the n+ source regions 16 and the p+ well contact regions 18, and a drain ohmic contact 28 is formed on the substrate 20.

For current to flow from the source contacts 32 to the drain contact 28, across the drift layer 22, a sufficient voltage may be applied to the gate contact 24 to create an inversion layer in the channel region 15 so that n-type carriers from the source regions 16 can traverse the well regions 14 and cross the drift region 22 and the substrate 20 to the drain contact 28.

As will be appreciated from the foregoing discussion, many of the regions of the device 10 of FIG. 1 can be advantageously formed by selective ion implantation. For example, the well regions 14, the source regions 16, the well contact regions 18, the JFET region 32 and the channel regions 15 can all be formed using ion implantation. These regions have widely varying depths and doping concentrations. Conventionally, the deeper regions, such as the JFET region 32 and the well regions 14 would be formed using multiple implant steps with a silicon dioxide mask layer to reduce/prevent channeling effects.

For example, a conventional device processing recipe may call for a deep p-type implant. It has been found that implanting $^{27}$Al ions at 360 keV results in unacceptably high levels of lattice damage, particularly at the End of Distribution (EOD), i.e. the deepest penetration of the ions, as well as at the sides of the implant pattern. As a result, it has been necessary to form the deep p-type regions 34 using multiple implant steps of double ionized $^{27}$Al++ ions, which requires ten times more time to perform the implant. The channel implants and JFET region implants also suffer from unacceptable levels of lattice damage at the EOD and sides of the implant pattern. Some embodiments enable the formation of deep implants in silicon carbide using low energy ion implantation.

Figure 2:
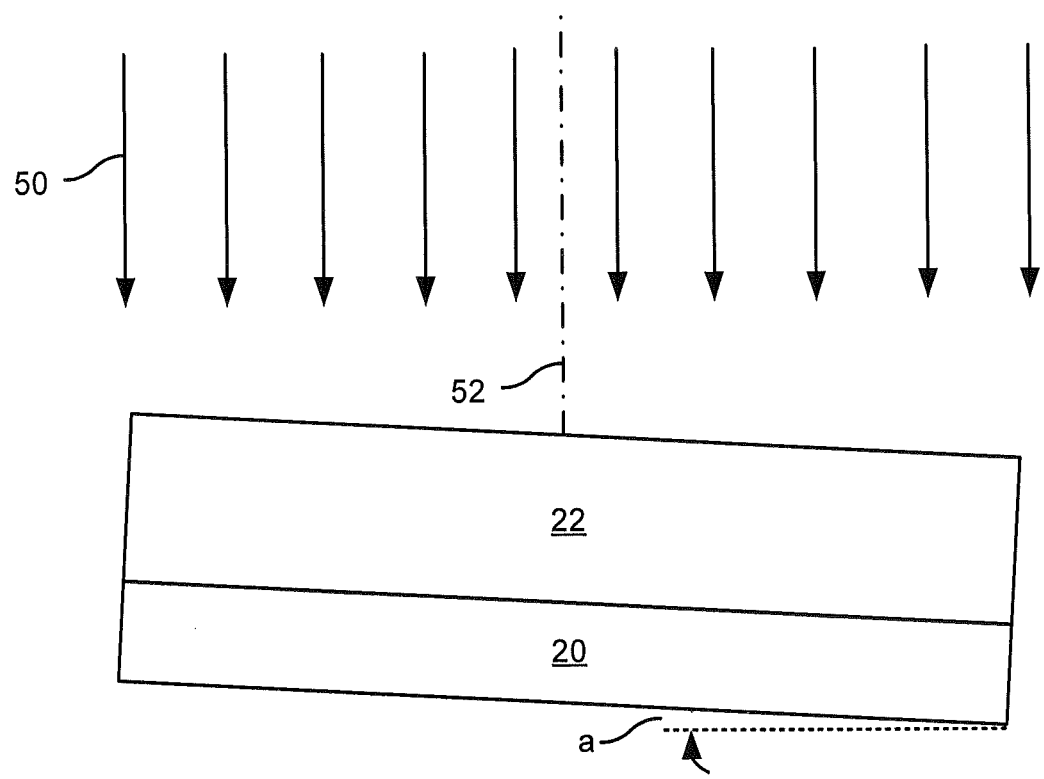
FIG. 2 is a schematic diagram illustrating channeled ion implantation in accordance with some embodiments.

According to some embodiments, channeled ion implantation may be used to form one or more doped regions in a silicon carbide semiconductor device. Referring to FIG. 2, a silicon carbide substrate 20 on which an epitaxial layer 22 is formed may be implanted with ions 50. The direction of implantation may be substantially parallel to the c-axis of the hexagonal semiconductor lattice of the substrate 20 and the epitaxial layer 22. As used herein, substantially parallel means that the direction of implantation is less than 2° different from the direction of the c-axis of the semiconductor lattice.

As noted above, the silicon carbide substrate 20 and the epitaxial layer 22 formed thereon may have an off-axis orientation of, for example, 2° to 10°. Thus, as illustrated in FIG. 2, the c-axis 52 of the silicon carbide substrate 20 may be aligned with the direction of travel of the implants 50 by tilting the substrate 20 at a tilt angle a that is equal to the off-axis angle of the substrate. The angle of implantation can be tightly controlled (to a resolution, for example, of 0.1°) using Rutherford backscattering to align the substrate with the implant beam.

An implant mask (not shown) may be provided on the epitaxial layer 22 to define regions of the epitaxial layer that are to be implanted.

High temperature ion implantation may be performed in an apparatus as described, for example, in U.S. Pat. No. 7,547,897, entitled "High-temperature ion implantation apparatus and methods of fabricating semiconductor devices using high-temperature ion implantation," assigned to the assignee of the present application, the disclosure of which is incorporated herein by reference as if fully set forth herein.

According to some embodiments, various doped regions in a silicon carbide device structure can be formed by implanting ions directly into a silicon carbide layer without first passing through a screen layer and substantially in alignment with a crystallographic axis of the silicon carbide layer to result in channeling effects. The implant may be performed at a temperature that is greater than room temperature and that is selected to provide a desired depth of implant.

The depth of the implant may also be controlled by precisely controlling the tilt angle of the wafer relative to the implant direction and the implant temperature. For example, by increasing the temperature of implantation, it may be possible to reduce the depth of channeled implants. By implanting the ions at an angle that is slightly tilted relative to the crystallographic axis, for example at an angle greater than 0° and less than about 2°, the depth of the implant can be controlled further.

Figure 3:
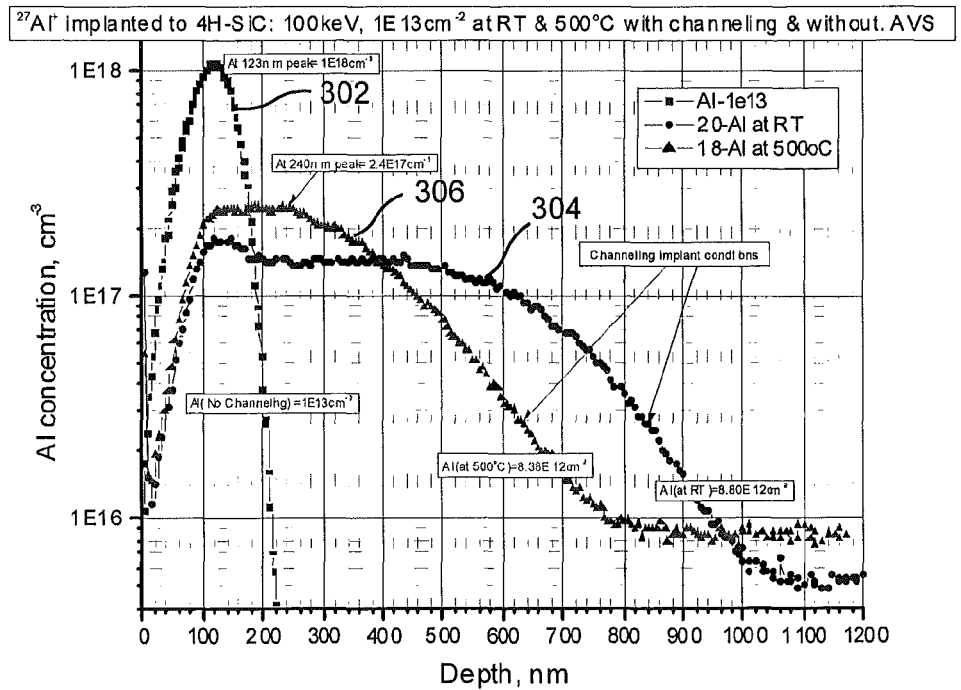
FIG. 3 is a graph showing secondary ion mass spectroscopy (SIMS) analysis data for $^{27}$Al ions implanted with channeling into a 4H—SiC wafer at 100 keV at room temperature and at 500° C., and TRIM simulation data for implantation of $^{27}$Al ions without channeling.

FIG. 3 is a graph showing secondary ion mass spectroscopy (SIMS) analysis data for $^{27}$Al ions implanted with channeling into a 4H—SiC wafer at 100 keV at room temperature and at 500° C., and TRIM simulation data for implantation of $^{27}$Al ions without channeling. In FIG. 3, curve 302 represents TRIM simulation data for implantation of $^{27}$Al ions without channeling, curve 304 represents SIMS analysis data for $^{27}$Al ions implanted with channeling into a 4H—SiC wafer at 100 keV at room temperature, and curve 306 represents SIMS analysis data for $^{27}$Al ions implanted with channeling into a 4H—SiC wafer at 100 keV at 500° C.

As can be seen in FIG. 3, both of the channeled implants (curves 304 and 306) have significantly greater depths than the non-channeled implants (curve 302). Moreover, the channeled implants performed at 500° C. (curve 306) have a significantly shorter depth than the channeled implants performed at room temperature (curve 304).

Figure 4:
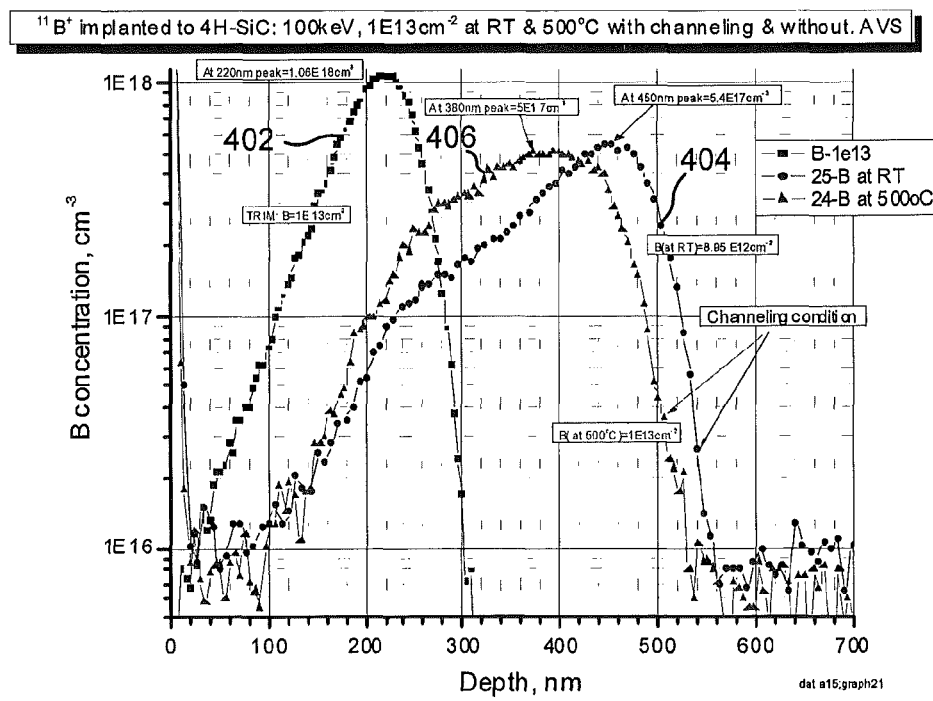
FIG. 4 is a graph showing secondary ion mass spectroscopy (SIMS) analysis data for $^{11}$B ions implanted with channeling into a 4H—SiC wafer at 100 keV at room temperature and at 500° C., and TRIM simulation data for implantation of $^{11}$B ions without channeling.

Similarly, FIG. 4 is a graph showing SIMS analysis data for $^{11}$B ions implanted with channeling into a 4H—SiC wafer at 100 keV at room temperature and at 500° C., and TRIM simulation data for implantation of $^{11}$B ions without channeling. In FIG. 4, curve 402 represents TRIM simulation data for implantation of $^{11}$B ions without channeling, curve 404 represents SIMS analysis data for $^{11}$B ions implanted with channeling into a 4H—SiC wafer at 100 keV at room temperature, and curve 406 represents SIMS analysis data for $^{11}$B ions implanted with channeling into a 4H—SiC wafer at 100 keV at 500° C.

As can be seen in FIG. 4, both of the channeled implants (curves 404 and 406) have significantly greater depths than the non-channeled implants (curve 402). Moreover, the channeled implants performed at 500° C. (curve 406) have a slightly shorter depth but better doping uniformity than the channeled implants performed at room temperature (curve 404).

Figure 5A:
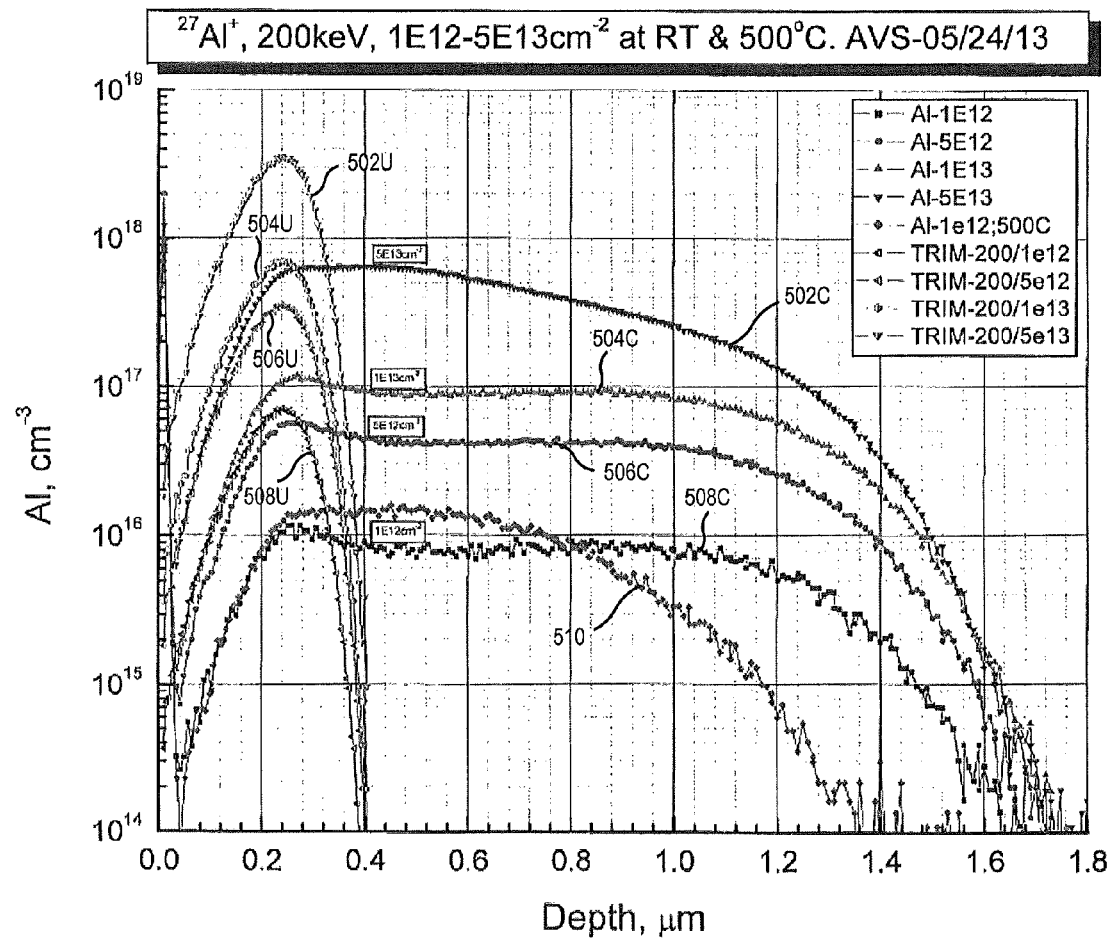
FIG. 5A is a graph showing secondary ion mass spectroscopy (SIMS) analysis data for $^{27}$Al ions implanted with channeling into a 4H—SiC wafer at 200 keV at room temperature and at 500° C., and TRIM simulation data for implantation of $^{27}$Al ions without channeling.

FIG. 5A illustrates additional experimental (SIMS) and simulation (TRIM) results. In particular, FIG. 5A is a graph showing secondary ion mass spectroscopy (SIMS) analysis data for $^{27}$Al ions implanted with channeling into a 4H—SiC wafer at 200 keV at room temperature and at 500° C., and TRIM simulation data for implantation of $^{27}$Al ions without channeling. The curves 502C-508C, 502U-508U and 510 correspond to the conditions shown in Table 1 below:

TABLE 1

| Curve | Source | Species | Dose | Temperature |
|---|---|---|---|---|
| 502C | SIMS | $^{27}$Al | 5E13 cm$^{-2}$ | Room |
| 502U | TRIM | $^{27}$Al | 5E13 cm$^{-2}$ | Room |

TABLE 1-continued

| Curve | Source | Species | Dose | Temperature |
|---|---|---|---|---|
| 504C | SIMS | $^{27}$Al | 1E13 cm$^{-2}$ | Room |
| 504U | TRIM | $^{27}$Al | 1E13 cm$^{-2}$ | Room |
| 506C | SIMS | $^{27}$Al | 5E12 cm$^{-2}$ | Room |
| 506U | TRIM | $^{27}$Al | 5E12 cm$^{-2}$ | Room |
| 508C | SIMS | $^{27}$Al | 1E12 cm$^{-2}$ | Room |
| 508U | TRIM | $^{27}$Al | 1E12 cm$^{-2}$ | Room |
| 510 | SIMS | $^{27}$Al | 1E12 cm$^{-2}$ | 500° C. |

As can be seen in FIG. 5A, at an implant energy of 200 keV, highly uniform doping is obtained for the channeled implants at a depth of between about 0.2 microns and 1.2 microns. Note, however, that as the dose increases from 1E12 cm$^{-3}$ and 5E13 cm$^{-3}$, a secondary peak begins to appear at a depth of about 0.4 microns, and the doping concentration starts to fall with depth. This may be attributed to increased lattice damage caused by high fluences of dopant ions. Thus, as the dose is made higher, it may become more and more difficult to activate the implanted ions, leading to lower activation percentages.

As indicated by curve 510, high temperature implantation successfully reduced the depth of the implants by about 0.4 microns.

Figure 5B:
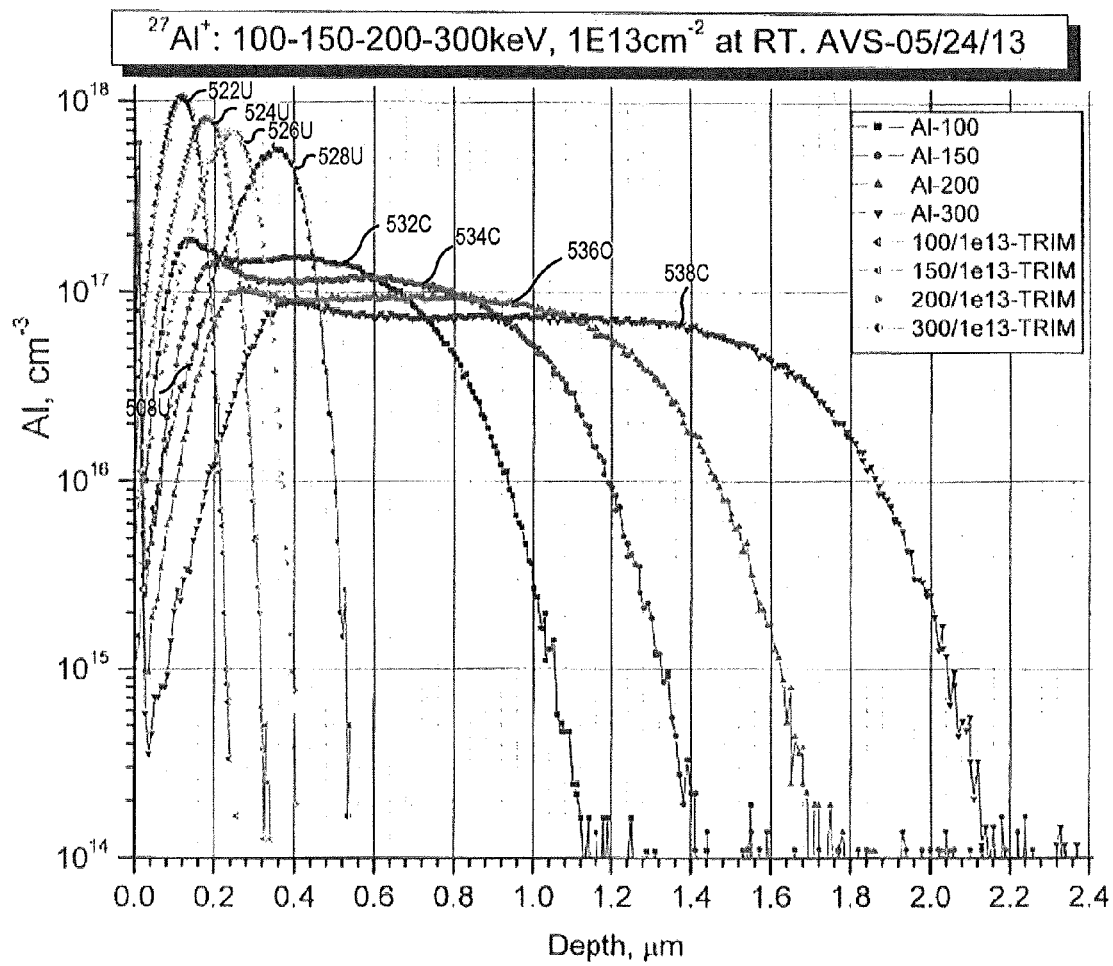
FIG. 5B is a graph showing secondary ion mass spectroscopy (SIMS) analysis data for $^{27}$Al ions implanted at various implant energies with channeling into a 4H—SiC wafer at room temperature, and TRIM simulation data for implantation of $^{27}$Al ions without channeling.

FIG. 5B is a graph showing secondary ion mass spectroscopy (SIMS) analysis data for $^{27}$Al ions implanted with a dose of 1E13 cm$^{-2}$ at various implant energies with channeling into a 4H—SiC wafer at room temperature, and TRIM simulation data for implantation of $^{27}$Al ions without channeling. The curves 522U-528U and 532C-538C correspond to the conditions shown in Table 2 below:

TABLE 2

| Curve | Source | Species | Energy | Temperature |
|---|---|---|---|---|
| 522U | TRIM | $^{27}$Al | 100 keV | Room |
| 524U | TRIM | $^{27}$Al | 150 keV | Room |
| 526U | TRIM | $^{27}$Al | 200 keV | Room |
| 528U | TRIM | $^{27}$Al | 300 keV | Room |
| 532C | SIMS | $^{27}$Al | 100 keV | Room |
| 534C | SIMS | $^{27}$Al | 150 keV | Room |
| 536C | SIMS | $^{27}$Al | 200 keV | Room |
| 538C | SIMS | $^{27}$Al | 300 keV | Room |

Note that the implant depth increases in direct proportion with increasing implant energy, and that no secondary peak is apparent.

Implant depth can also be controlled by carefully controlling the tilt angle of the implantation. Rotation angle during implantation may also affect dopant distributions of channeled implants.

According to some embodiments, a silicon carbide layer may be implanted with ions at an implant angle less than 2° at an implant energy less than about 100 keV and a temperature greater than 300° C. to provide an implanted region having a depth that is less than about 1 micron, in some cases less than about 0.5 microns, in some cases less than about 0.3 microns, in some cases less than about 0.2 microns, and in some cases less than about 0.1 microns. In some embodiments, the implantation may be performed at a temperature greater than 400° C., in some embodiments at a temperature greater than 600° C., in some embodiments at a temperature greater than 1000° C., and in some embodiments at a temperature greater than 1100° C. In some cases, the silicon carbide layer may be implanted at an implant angle that is less than 1°, in some cases less than 0.5°, in some cases between 0.1° and 0.5°, and in some cases less than 0.1°.

In some embodiments, the ions may be implanted at a dose that is less than 1E13 cm$^{-2}$.

Although not wishing to be bound by a particular theory, it is presently believed that when ion implantation is performed on a semiconductor layer, two types of defects are introduced into the semiconductor layer. The first type of defect (Type I defects) is caused when implanted ions break bonds of the atoms in the lattice structure of the semiconductor layer. The second type of defect (Type II defects) is a defect in the location of the implanted ions themselves, as the implanted ions may not come to rest at an electrically active position within the semiconductor lattice. Annealing repairs the lattice damage caused by the ion implantation, and also encourages the implanted ions to move to electrically active sites in the semiconductor lattice. High temperature implantation tends to reduce the occurrence of Type I defects, while channeling tends to reduce the occurrence of Type II defects.

Thus, a semiconductor layer implanted using high temperature channeled implants may require an anneal for a time and/or temperature that may be significantly lower than would otherwise be required for a similar depth implant due to the reduced lattice damage caused by the low energy, high temperature channeled implants. In some cases, the time-temperature product of the anneal may be more than ten times lower than would otherwise be required for a similar depth implant. In particular embodiments, the semiconductor layer may be annealed at a temperature of less than about 1000° C. for a time of less than about 30 hours to activate the implanted channeled ions.

In particular embodiments, the implant angle may be controlled to within 0.1° accuracy to obtain a controllable result. Such accuracy is obtainable, for example, with the VIISTa 810 ion implanter manufactured by Varian Semiconductor Associates, Gloucester Mass., USA.

It will be noted that in silicon device processing, high temperature channeled ion implantation is not expected to have similar effects as high temperature channeled ion implantation in silicon carbide. Silicon is generally less robust than silicon carbide, thus is more susceptible to lattice damage during ion implantation than silicon carbide, even when the implantation is channeled. This lattice damage tends to close the channels, limiting the depth of the implants. However, it will be noted that even in silicon carbide, lattice damage can limit the implant depth of channeled implants as the dose is increased. For example, M. Janson, et al., "Channeled Implants in 6H Silicon Carbide," Mat. Sci. For. Vols. 338-342 (2000), pp, 889-892 describes the dependence of implant depth on dose for high energy (>1 MeV) channeled implants. Janson et al. note that at 1.5 MeV implant energies, the implant range of $^{27}$Al implants begins to become dependent on dose at about 11×10$^{12}$ cm$^{-2}$. As can be seen from FIG. 5A, a similar effect can be observed for 200 keV implants in 4H—SiC.

Moreover, due to its crystal structure silicon experiences better crystallographic reconstruction after implantation than silicon carbide. In particular, silicon has a diamond cubic crystal structure that organizes vertically in the lattice. Thus, it is preferable with silicon to use high energy implants that amorphize the silicon atoms. The crystal structure of silicon can then be reconstructed by annealing. Silicon carbide, on the other hand, has a hexagonal crystal structure that organizes laterally. For example, epitaxial crystal growth in silicon carbide occurs by a lateral step-flow mechanism. It is therefore not desirable to amorphize the silicon carbide lattice, as it is difficult for the lattice to be reconstructed in the desired polytype, even with high temperature annealing.

Figure 6:
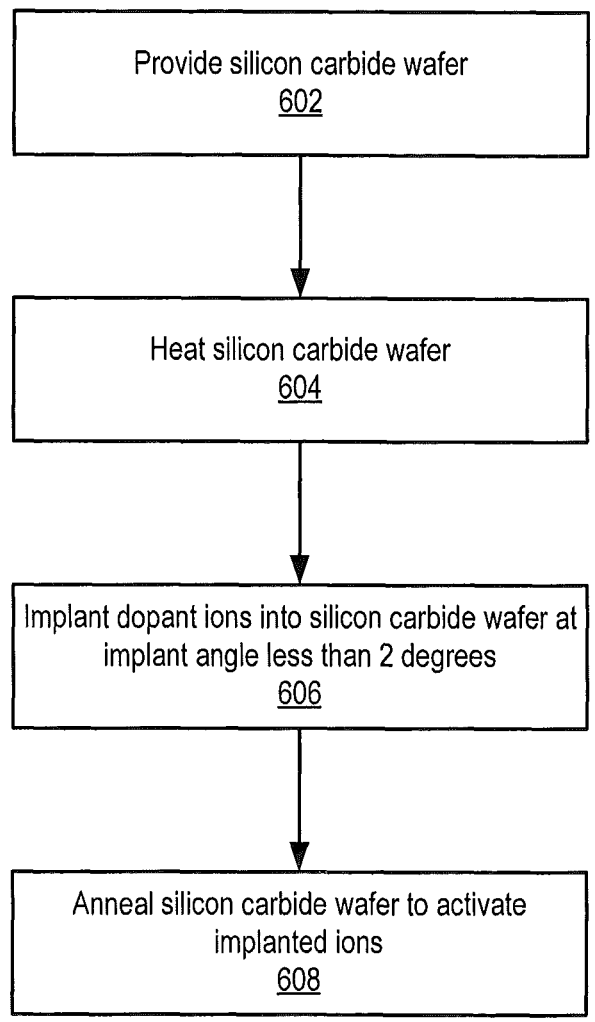
FIG. 6 is a block diagram illustrating operations according to some embodiments.

FIG. 6 is a block diagram illustrating operations for implanting silicon carbide layers according to some embodiments. As shown therein, operations according to some embodiments include providing a silicon carbide layer (block 602), heating the silicon carbide layer to a temperature of greater than 400° C., in some cases greater than 600° C., in some cases greater than 1000° C., and in some cases greater than 1100° C., (block 604), implanting dopant ions into the heated silicon carbide layer at an implant angle of less than about 2° (block 606), and annealing the silicon carbide layer to activate the implanted ions (block 608). In particular, the silicon carbide layer may be annealed at a time temperature product of less than about 30,000° C.-hours to activate the implanted ions. For example, an anneal carried out for 30 hours at 1000° C. would have a time-temperature product of 30,000° C.-hours. In some cases, the silicon carbide layer may be annealed at a time-temperature product of less than about 25,000° C.-hours to activate the implanted ions, and in some cases, the silicon carbide layer may be annealed at a time-temperature product of less than about 20,000° C.-hours to activate the implanted ions.

In some embodiments, the silicon carbide layer may be annealed at a temperature of less than 1200° C., in some cases less than 1100° C., in some cases less than 1000° C., and in some cases less than 600° C.

Some further embodiments of power semiconductor devices that incorporate channeled implants in silicon carbide will now be described. In vertical power devices, the blocking voltage rating of the device is determined by the thickness and the doping of the drift region. Typically, during the design phase, a desired blocking voltage rating is selected, and then the thickness and doping of the drift region are chosen based on the desired blocking voltage rating.

When vertical power semiconductor devices are operated in the reverse blocking (i.e., non-conducting) mode, the electric field profile in the drift region is triangular, with the peak of the electric field appearing close to the P-N junction. For reducing the ON resistance of the drift region, it is desirable to increase the doping concentration in the drift region. However, as the doping concentration of the drift region increases, the peak electric field in the drift region in the blocking mode of operation also increases. The increase in peak electric field reduces the breakdown voltage of the device in the blocking mode. Thus, there is a tradeoff between ON resistance and blocking voltage for such devices due to the relationship between the blocking voltage and the doping level of the drift layer. However, for a desired blocking voltage, there may be an optimal selection of drift layer doping and drift layer thickness that minimizes the drift resistance. This is known as the one-dimensional unipolar limit for 4H—SiC.

Some embodiments reduce the resistance of unipolar vertical power devices, such as Schottky diodes—including Junction Barrier Schottky (JBS) and Merged PN-Schottky (MPS) diodes, DMOSFETs and UMOSFETs, BJTs, etc., beyond the one-dimensional limit imposed by the resistance of the voltage supporting region, which is typically the drift layer or drift region. This may be accomplished by using deep implants (e.g. implanted ions at a depth of 2.5 microns to 5 microns or more) of the opposite polarity as that of the drift region. These implanted regions may compensate for the charge in the drift region in the blocking mode of operation. Power semiconductor devices with this feature are known as super-junction devices. In superjunction devices, the electric field in the blocking mode is no longer triangular or one-dimensional, and depending on how the device is designed, the peak of the electric field can be shifted away from the junction. This may allow the doping of the drift region, to be increased beyond what is typically allowed by the one-dimensional unipolar limit. Thus, the resistance of the drift region can be made smaller than conventional vertical devices for the same or similar voltage rating.

Devices according to embodiments described herein may differ from conventional devices in that they include a region of the opposite polarity type as that of the drift region that is formed using deep ion implantation. As described herein, the deep implants may be achieved by using channeled implants. Using channeling ion implantation conditions as described herein ran improve the quality of the implanted SiC layer, which may enable better performance and/or stability of the resulting devices.

The use of high implant energies to form deeply implanted regions may be enhanced using channeling. Ordinarily, high energy implants are believed to be detrimental to device performance because of the increased lateral distribution of implanted ions, as well as the increased concentration of end-of-range defects (ERDs) introduced into the semiconductor lattice as a result of the high energy implants. The use of channeling to increase the implant range may reduce ERDs, and may also reduce the lateral distribution of implants, which provides better process control and smaller feature sizes. In addition, thinner implant masks may be used when channeled implantation is performed, because the implant energies may be lower than would otherwise be required to achieve similar implant ranges. In some cases, the implant mask may be less than half the thickness that would otherwise be required to obtain similar implant ranges.

For example, to achieve a junction depth of 3.5 µm in SiC without channeling, it is necessary to perform the implant at an implant energy of 5 MeV. For that implant energy, a $SiO_2$ mask having a thickness of 5.0 µm is needed. In contrast, with channeling, a junction depth of 3.5 µm may be achieved using channeled implants of $^{27}Al$ ions at an implant energy of 750 keV. For such an implant energy, a $SiO_2$ may be used that has a thickness less than 5.0 µm. In some cases, the mask may have a thickness less than 3 µm, and in some cases less than 2 µm. In some embodiments, a mask having a thickness of 1.4 µm may be used as an implant mask for a channeled implant at an implant energy of 750 keV. Accordingly, in some embodiments, the mask may have a thickness less than 60% of the mask thickness that would be required for non-channeled implants to obtain a similar junction depth, and in some cases less than 40% of the thickness that would be required for non-channeled implants to obtain a similar junction depth. In some embodiments, a mask having a thickness of less than 30% of the thickness that would be required for non-channeled implants to obtain a similar junction depth may be used as an implant mask for a channeled implant.

End-of-range defects are believed to have a large impact on device performance. Because channeling reduces ERDs, the use of channeling may have a significant impact on device performance. Moreover, because of the relative strength of the silicon carbide lattice, silicon carbide is expected to handle channeled implants without significant lattice damage much better than conventional semiconductor materials, such as silicon.

For channeled implants at lower energies, e.g. about 10 keV or lower, it is believed that most of the ion collisions that limit the implant range are nuclear collisions, i.e., collisions with atomic nuclei in the lattice. This increases the amount of implant damage suffered by the semiconductor crystal lattice. Conversely, it is believed that for higher energy (i.e., deeper) channeled implants, the implanted ions experience relatively more collisions with the electron cloud within the semiconductor lattice, resulting in less lattice damage. Thus, from the standpoint of lattice damage, channeled implants behave very differently from non-channeled implants. For non-channeled implants, the amount of lattice damage caused by the implantation generally increases with implant energy. Therefore, channeled implants may be particularly well suited for forming very deep implanted regions, e.g. 2.5 microns or greater.

Figure 7:
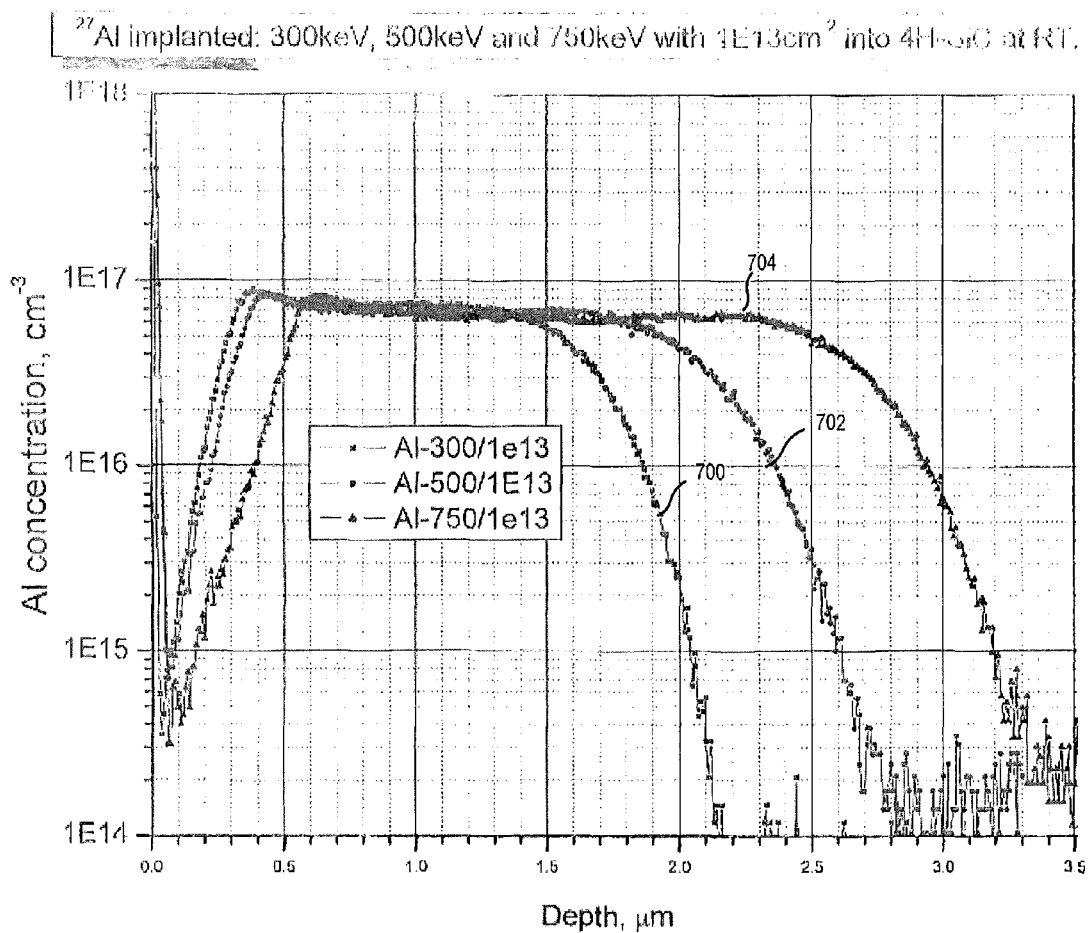
FIG. 7 is a graph illustrating SIMS analysis data for $^{27}$Al ions implanted at various implant energies with channeling into a 4H—SiC wafer at room temperature.

FIG. 7 shows a distribution of channeled implanted $^{27}$Al in a 4H—SiC wafer along the C-axis, as measured by secondary ion mass spectroscopy (SIMS). The implants were performed at room temperature with energy levels of 300, 500 and 750 keV and a dose in each case of 1E13 cm$^{-2}$. In particular, curve 700 shows the measured distribution of Al atoms implanted at an energy of 300 keV, curve 702 shows the measured distribution of Al atoms implanted at an energy of 500 keV, and curve 704 shows the measured distribution of Al atoms implanted at an energy of 750 keV.

The implants illustrated in FIG. 7 were performed without an SiO$_2$ screen layer directly on the surface of the SIC wafer. For such implant energies, the expected penetration depth Rp for $^{27}$Al without channeling would be: Rp=0.33 µm for 300 keV; Rp=0.52 µm for 500 keV; Rp=0.71 µm for 750 keV. The channeling condition enabled the implanted Al atoms to extend about four times deeper into the wafer with a flat concentration of about 7E16 cm$^{-3}$, which is reasonable for a deep p-type doping level.

FIG. 7 illustrates that the implanted regions obtained through channeled implantation may have a high level of doping uniformity. In particular, in some embodiments, a single implanted region may be obtained that has a distribution that varies from its peak distribution by less than about 25% over a large depth. For example, curve 700 of FIG. 7 (corresponding to 300 keV implants) represents an implanted region that has a doping concentration that varies from about 9E17 cm$^{-3}$ to about 7E17 cm$^{-3}$ over a depth of about 1 micron. Curve 702 of FIG. 7 (corresponding to 500 keV implants) represents an implanted region that has a doping concentration that varies from about 9E17 cm$^{-3}$ to about 7E17 cm$^{-3}$ over a depth of about 1.5 microns. Curve 704 of FIG. 7 represents an implanted region that has a doping concentration that varies from about 8.5E17 cm$^{-3}$ to about 6E17 cm$^{-3}$ over a depth of about 1.75 microns.

As described above, a channeling implant process is difficult to control in some type of implant devices. The ion channeling process requires a high degree of parallelism of the ion beam and precise orientation of the wafer to the ion beam direction in the ion implant device, especially when processing large diameter wafers. Tight control of these parameters may enable a consistent doping distribution, which helps to achieve proper and reproducible results. The use of channeled implants as described herein can also reduce the need for multiple implants to achieve a specified sheet resistance.

When channeling is not utilized, it may be possible to obtain deep implants using high implant energies. For example, deep p-type implants may be obtained using single condition implantation of $^{27}$Al ions at an implant energy of 360 keV. The implant may be performed using a "screen" SiO$_2$ layer to obtain a reproducible distribution of implanted ions in the target wafer while holding the target wafer at an orientation of about 4 degrees-off from the C-axis toward the (11-20) axis. However, such implant conditions may result in an unacceptably high degree of lattice damage at the ions' End Of Distribution (EOD), as well as side damage in the lateral directions.

Using channeling implants along the C-axis to form some features of a SiC-based device can reduce the number of implant conditions required to obtain a deep dopant distribution and at the same time reduce lattice damage. Reduced lattice damage may also reduce the post implant-anneal temperature and/or anneal time.

Superjunction DMOSFET structures rated at 1200V reverse blocking voltage are illustrated in FIGS. 8A and 8B. In particular, FIG. 8A shows a conventional 1200V SiC DMOSFET structure 800A, while FIG. 8B shows a superjunction DMOSFET structure 800B formed according to some embodiments using a deep p-type channeling implant.

Referring to FIG. 8A, the conventional DMOSFET structure 800A may include an n+ substrate 802, and an n-type drift layer 804 having a doping concentration of about 8E15 cm$^{-3}$ on the substrate 802. The drift layer 804 has a thickness of about 7.5 microns. An n-type spreading layer 806 having a thickness of about 2.5 microns and a doping concentration of about 2E16 cm$^{-3}$ is on the drift layer 804. The doping concentration of the n-type spreading layer 806 is greater than the doping concentration of the drift layer 804. The drift layer 804 and the n-type spreading layer 806 may together form a drift region of the device 800A.

A p+ well region 808 is formed in the n-type spreading layer 806, and an n+ source region 810 is formed in the p+ well region 808. The n+ source region 810 is degeneratively doped to have a doping concentration greater than about 1E20 cm$^{-3}$. Likewise, the p+ well region 808 is degeneratively doped to have a doping concentration greater than about 1E20 cm$^{-3}$. The doping concentrations of the n+ source layer 810 and the p+ well layer 808 are respectively greater than the doping concentrations of the n-type current spreading layer 806, the JFET region 812 and the drift layer 804.

An n-type JFET implant region 812 is formed in the n-type spreading layer 806 adjacent the p+ well region 808. The n-type JFET region has a doping concentration that is greater than the doping concentration of the n-type current spreading layer 806. A gate insulating layer 820 is on the n-type spreading layer 806, and a gate contact 814 is on the gate insulating layer 820. A source contact 818 is formed on the n+ source region 810 and contacts the p+ well region 808. A drain contact 822 is formed on the substrate 802.

Although the DMOSFET structure 800B shown in FIG. 8B has a similar structure as the DMOSFET structure shown in FIG. 8A, the use of channeled implants enables the formation of additional/different features in the structure. In particular, the structure 800B includes a deep p-implanted region 850 beneath the p+ well 808. The deep p-implanted region 850 may have a doping concentration of about 1E17 cm$^{-3}$.

The deep p-implanted region 850 may extend to a depth of about 4.5 microns into the drift region. The deep p-type layer 850 may not be so deep, however, as to extend completely through the n-type spreading layer 846.

The structure 800B also has a thinner, more highly doped drift layer 844, and a thicker, more highly doped n-type spreading layer 846. Both the n-type spreading layer 846 and the drift layer 844 may have thicknesses of about 5 microns.

That is, the n-type spreading layer 846, which is more heavily doped than the drift layer 844, may be formed to extend deeper into the structure than the deep p-implanted region 850, which is doped more heavily than both the n-type spreading layer 846 and the drift layer 844.

Because the deep p-type implants in the region 850 compensate for the charges in the drift region, the top portion of the drift region (i.e., the n-type spreading layer 846) can be doped more heavily than would otherwise be possible for a conventional structure. This enables the device 800B to have lower on-resistance than would otherwise be possible for a given blocking voltage. In particular, the device 800B has a higher doping in the spreading layer 846 as well as the drift layer 844. The ON resistance is determined by the resistance of both these layers, and hence it is reduced in the device structure 800B illustrated in FIG. 8B.

The bottom portion of the drift region (below the deep p-implanted region 850) may also be doped more heavily than the corresponding portion of the conventional structure, e.g. to about $1.5E16$ cm$^{-3}$.

In some embodiments the deep p-implanted region 850 may extend to a depth of 2 to 5 microns and may have a doping concentration of $1E16$ cm$^{-3}$ to $2E17$ cm$^{-3}$. The n-type spreading layer 846 may extend to a depth of 2 to 5 microns and may have a doping concentration of $1E16$ cm$^{-3}$ to $2E17$ cm$^{-3}$. The drift, layer 844 may have a thickness of 0 to 10 microns and may have a doping concentration of $6E15$ cm$^{-3}$ to $2E16$ cm$^{-3}$.

The deep p-type implanted region may be formed by channeled ion implantation as described above. In particular, the deep p-type implanted region may be formed by implanting dopant ions into the silicon carbide drift region at an implant angle between a direction of implantation and a crystallographic axis of the drift layer of less than about 2°, and annealing the silicon carbide layer at a time-temperature product of less than about 30,000° C.-hours to activate the implanted ions.

The implant angle may be greater than 0.1° in some embodiments. In some embodiments, the implant angle may be between 0.1° and 1°, and in some embodiments between 0.1° and 5°. To achieve an implant depth of 4.5 microns, the implantation may be performed at room temperature with an implant angle of 0° and an implant energy of 900 keV or greater.

The deep p-type implants may be annealed as described above at a time-temperature product of less than about 30,000° C.-hours to activate the implanted ions.

The electric field in the drift region of the devices in the blocking mode operation at 1200V, calculated using 2D simulations, is shown in FIG. 9. In particular, curve 902 is a graph of the electric field in the conventional device structure shown in FIG. 8A, while curve 904 is a graph of the electric field in the device structure shown in FIG. 8B.

As illustrated by curve 902, the conventional device structure of FIG. 8A has a generally triangular shaped electric field, with the peak field appearing at the junction at a depth of about 1 μm. In the superjunction device of FIG. 8B, the electric field indicated by curve 904 is generally trapezoidal for the first 45 μm, and the peak electric field is lower than that of the conventional device.

The device simulations also show that the conventional device structure of FIG. 8A has a specific ON resistance of 3 mΩ-cm2 at 25° C. and 4.4 mΩ-cm2 at 150° C., whereas the superjunction device structure of FIG. 8B has a specific ON resistance of 2.5 mΩ-cm2 at 25° C. and 3.3 mΩ-cm2 at 150° C. The large decrease in ON resistance is believed to be due to the heavier drift doping for the superjunction device.

Embodiments of the present inventive concepts can be applied to many different types of power semiconductor devices, including but not limited to trench MOSFETs, JBS and MPS diodes, JFETs or IGBTs with a deep P implant and two layer drift regions similar to the structure shown in FIG. 8B.

Moreover, embodiments of the present inventive concepts can be applied to many different types of power semiconductor devices, including but not limited to trench MOSFETs, JBS and MPS diodes, JFETs or IGBTs with single layer drift regions.

Figure 10:
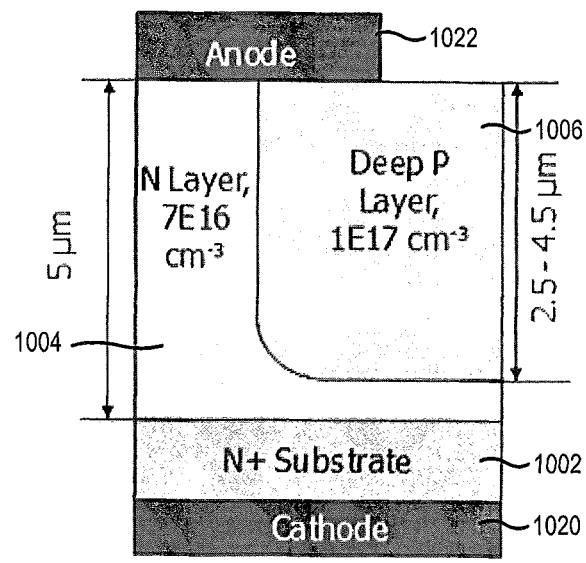
FIG. 10 is a schematic block diagram illustrating a superjunction Junction Barrier Schottky (JBS) diode according to some embodiments.

For example, FIG. 10 illustrates a Schottky diode including a deep p-type implanted region 1006 formed in an n-type drift layer 1004 on an n+ substrate 1002. The deep p-type implanted layer 1006 may have a depth of about 2.5 microns to 4.5 microns with a doping concentration of about $1E17$ cm$^{-3}$. The deep p-type implanted region 1006 may be formed in an n-type drift layer 1004 having a thickness of about 5 microns (i.e. greater than the depth of the deep p-type implanted region 1006) and a doping concentration of about $7E16$ cm$^{-3}$. An anode 1022 is formed on the drift layer 1004, and a cathode contact 1020 is formed on the substrate 1002.

Figure 11:
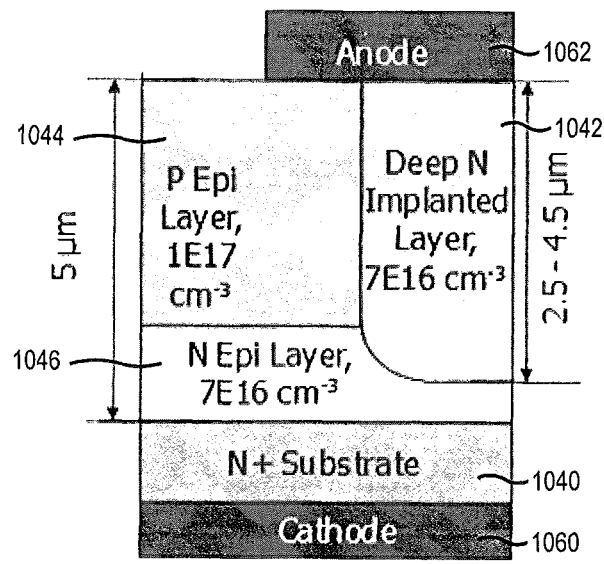
FIG. 11 is a schematic block diagram illustrating a superjunction JBS diode according to further embodiments.

Superjunction devices according to some embodiments can also be fabricated using a deep channeled implant of an n-type dopant (such as nitrogen or phosphorus). In this case, a compensating p-type layer is formed using epitaxial growth. An example of this is shown in FIG. 11, which illustrates a Schottky diode structure including an n-type drift layer 1046 on an n+ substrate 1040. The n-type drift layer 1046 has a doping concentration of $7E16$ cm$^{-3}$. A p-type epitaxial layer 1044 having a doping concentration of $1E17$ cm$^{-3}$ is formed on the n-type drift layer 1046. The total thickness of the drift layer 1046 and the p-type epitaxial layer 1044 is about 5 microns. A deep n-type implanted region 1042 having a net doping concentration of about $7E16$ cm$^{-3}$ extends through the p-type epitaxial layer 1044 and into the n-type drift layer 1046. The deep n-type implanted region 1042 may have a depth of about 2.5 microns to about 4.5 microns.

Many different embodiments have been disclosed herein, in connection with the above description and the drawings. It will be understood that it would be unduly repetitious to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

That which is claimed:

1. A method of forming a semiconductor structure, comprising:
   providing a silicon carbide layer having a crystallographic axis;
   heating the silicon carbide layer to a temperature of about 300° C. or more;

implanting dopant ions into the heated silicon carbide layer at an implant angle between a direction of implantation and the crystallographic axis of less than about 2°; and annealing the silicon carbide layer at a time-temperature product of less than about 30,000° C.-hours to activate the implanted ions.

2. The method of claim 1, wherein the implant angle is greater than 0.1°.

3. The method of claim 1, wherein the implant angle is between 0.1° and 1°.

4. The method of claim 1, wherein the implant angle is between 0.1° and 5°.

5. The method of claim 1, wherein the silicon carbide layer comprises an off-axis silicon carbide layer having an off-axis angle between about 2° and 10°.

6. The method of claim 1, further comprising controlling the implant angle to reduce a depth of the implanted ions in the silicon carbide layer compared to a depth the implanted ions would have if implanted at an implant angle of 0°.

7. The method of claim 1, further comprising maintaining the silicon carbide layer at a temperature of about 500° C. or more during the implantation.

8. The method of claim 1, further comprising maintaining the silicon carbide layer at a temperature of about 1000° C. or more during the implantation.

9. The method of claim 1, wherein implanting the dopant ions comprises implanting the dopant ions at an implant energy of about 100 keV or less, while controlling the implanted ions to have a depth of greater than 0.1 microns and less than 1.0 microns.

10. The method of claim 9, wherein implanting the dopant ions comprises implanting the dopant ions at an implant energy of about 100 keV or less, while controlling the implanted ions to have a depth of greater than 0.2 microns and less than 0.5 microns.

11. The method of claim 1, wherein implanting the dopant ions comprises implanting the dopant ions at an implant energy of about 50 keV or less, while controlling the implanted ions to have a depth of greater than 0.1 microns and less than 1.0 microns.

12. The method of claim 11, wherein implanting the dopant ions comprises implanting the dopant ions at an implant energy of about 50 keV or less, while controlling the implanted ions to have a depth of greater than 0.2 microns and less than 0.5 microns.

13. The method of claim 1, wherein implanting the dopant ions comprises implanting the dopant ions at an implant energy of about 30 keV or less, while controlling the implanted ions to have a depth of greater than 0.1 microns and less than 1.0 microns.

14. The method of claim 13, wherein implanting the dopant ions comprises implanting the dopant ions at an implant energy of about 30 keV or less, while controlling the implanted ions to have a depth of greater than 0.2 microns and less than 0.3 microns.

15. The method of claim 1, wherein implanting the dopant ions comprises implanting the dopant ions at an implant energy of about 10 keV or less, while controlling the implanted ions to have a depth of greater than 0.1 microns and less than 0.5 microns.

16. The method of claim 1, wherein the implanted ions have a depth in the silicon carbide layer that is less than a depth the implanted ions would have if implanted at room temperature.

17. The method of claim 1, wherein the silicon carbide layer is free of a screening layer when the dopant ions are implanted therein.

18. The method of claim 1, further comprising:
providing a mask on the silicon carbide layer, the mask exposing portions of the silicon carbide layer, wherein the mask has a thickness less than 60% of a thickness that would otherwise be required for implants performed at an energy level needed to obtain the same implant depth without channeling, and wherein implanting the dopant ions comprises implanting the dopant ions through the mask.

19. An article of manufacture, comprising:
a silicon carbide layer;
an implanted region in the silicon carbide layer containing implanted dopant atoms, wherein the implanted region extends to a depth of from about 2.5 microns to about 4.5 microns into silicon carbide layer and has a doping concentration that varies by less than about 25% from a peak concentration over a depth of at least about 1 micron.

20. The article of claim 19, wherein the implanted region has a doping concentration that varies by less than about 25% from a peak concentration over a depth of at least about 1.5 microns.

21. The article of claim 20, wherein the implanted region has a doping concentration that varies by less than about 25% from a peak concentration over a depth of at least about 1.75 microns.

22. The method of claim 1, wherein activation of the implanted dopants is performed before formation of ohmic contacts on the silicon carbide layer.

* * * * *

UNITED STATES PATENT AND TRADEMARK OFFICE
CERTIFICATE OF CORRECTION

PATENT NO. : 9,768,259 B2
APPLICATION NO. : 14/281384
DATED : September 19, 2017
INVENTOR(S) : Suvorov et al.

It is certified that error appears in the above-identified patent and that said Letters Patent is hereby corrected as shown below:

In the Specification

Column 15, Line 44: Please correct "from about 9E17 $cm^{-3}$ to about 7E17 $cm^{-3}$"
to read -- from about 9E16 $cm^{-3}$ to about 7E16 $cm^{-3}$ --
Lines 47-48: Please correct "from about 9E17 $cm^{-3}$ to about 7E17 $cm^{-3}$"
to read -- from about 9E16 $cm^{-3}$ to about 7E16 $cm^{-3}$ --
Lines 50-51: Please correct "from about 8.5E17 $cm^{-3}$ to about 6E17 $cm^{-3}$"
to read -- from about 8.5E16 $cm^{-3}$ to about 6E16 $cm^{-3}$ --

Column 17, Line 61: Please correct "for the first 45 μm" to read -- for the first 4.5μm --

Signed and Sealed this
Tenth Day of December, 2019

Andrei Iancu
*Director of the United States Patent and Trademark Office*